US011956955B2

(12) United States Patent
Hopkins et al.

(10) Patent No.: US 11,956,955 B2
(45) Date of Patent: Apr. 9, 2024

(54) METHOD USED IN FORMING A MEMORY ARRAY COMPRISING STRINGS OF MEMORY CELLS IN WHICH LINERS ARE ISOTROPICALLY ETCHED

(71) Applicant: Micron Technology, Inc., Boise, ID (US)

(72) Inventors: John D. Hopkins, Meridian, ID (US); Nancy M. Lomeli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 273 days.

(21) Appl. No.: 17/150,322

(22) Filed: Jan. 15, 2021

(65) Prior Publication Data

US 2022/0231042 A1 Jul. 21, 2022

(51) Int. Cl.
*H10B 43/27* (2023.01)
*H01L 21/225* (2006.01)
*H10B 41/27* (2023.01)

(52) U.S. Cl.
CPC ......... *H10B 43/27* (2023.02); *H01L 21/2254* (2013.01); *H10B 41/27* (2023.02)

(58) Field of Classification Search
CPC ...... H10B 43/27; H10B 41/27; H01L 21/2254
See application file for complete search history.

(56) References Cited

U.S. PATENT DOCUMENTS

| | | | |
|---|---|---|---|
| 2010/0109072 A1 | 5/2010 | Kidoh et al. | |
| 2015/0255481 A1* | 9/2015 | Baenninger | H01L 29/66833 438/268 |
| 2019/0288192 A1* | 9/2019 | Takahashi | H10N 70/8616 |
| 2019/0386108 A1* | 12/2019 | Nishikawa | H10B 43/27 |
| 2020/0035694 A1* | 1/2020 | Kaminaga | H10B 43/20 |

OTHER PUBLICATIONS

U.S. Appl. No. 16/739,581, filed Jan. 10, 2020, by Tiwari.
U.S. Appl. No. 16/807,573, filed Mar. 3, 2020, by Hopkins et al.
U.S. Appl. No. 17/091,420, filed Nov. 6, 2020, by Hopkins et al.

* cited by examiner

*Primary Examiner* — Lex H Malsawma
*Assistant Examiner* — Sean Ayers Winters
(74) *Attorney, Agent, or Firm* — Wells St. John P.S.

(57) ABSTRACT

A liner is formed laterally-outside of individual channel-material strings in one of first tiers and in one of second tiers. The liners are isotropically etched to form void-spaces in the one second tier above the one first tier. Individual of the void-spaces are laterally-between the individual channel-material strings and the second-tier material in the one second tier. Conductively-doped semiconductive material is formed against sidewalls of the channel material of the channel-material strings in the one first tier and that extends upwardly into the void-spaces in the one second tier. The conductively-doped semiconductive material is heated to diffuse conductivity-increasing dopants therein from the void-spaces laterally into the channel material laterally there-adjacent and upwardly into the channel material that is above the void-spaces.

17 Claims, 15 Drawing Sheets

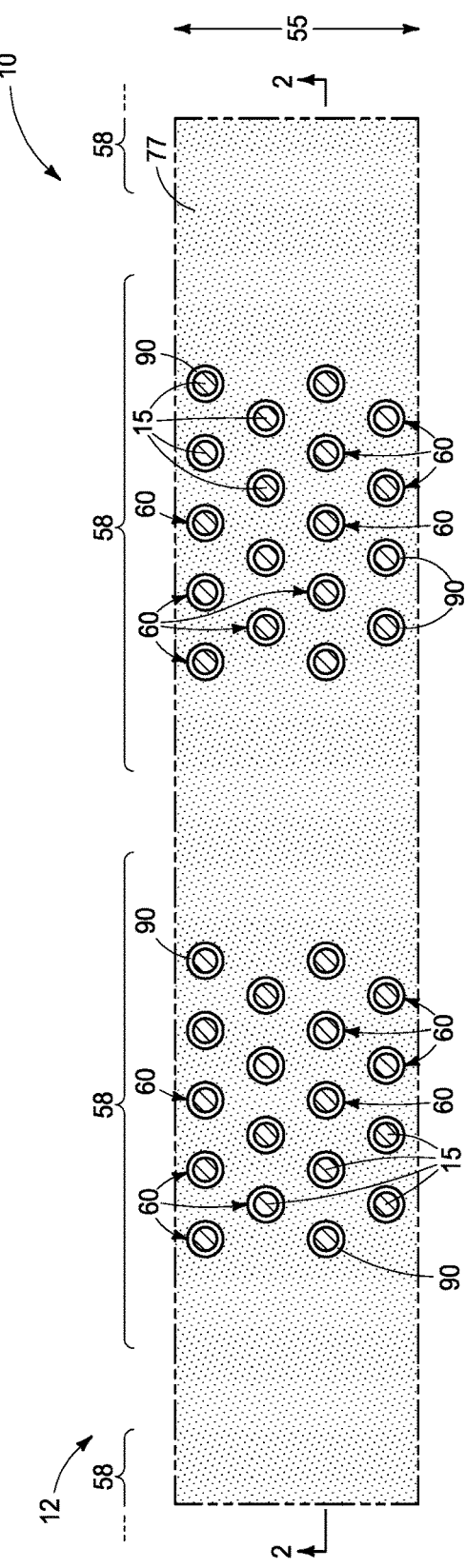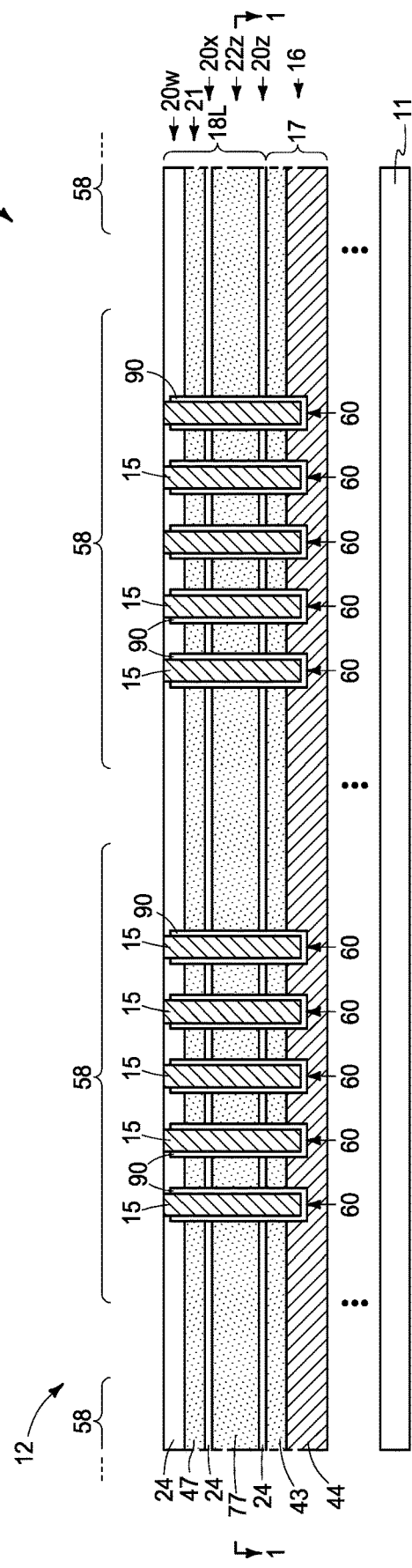

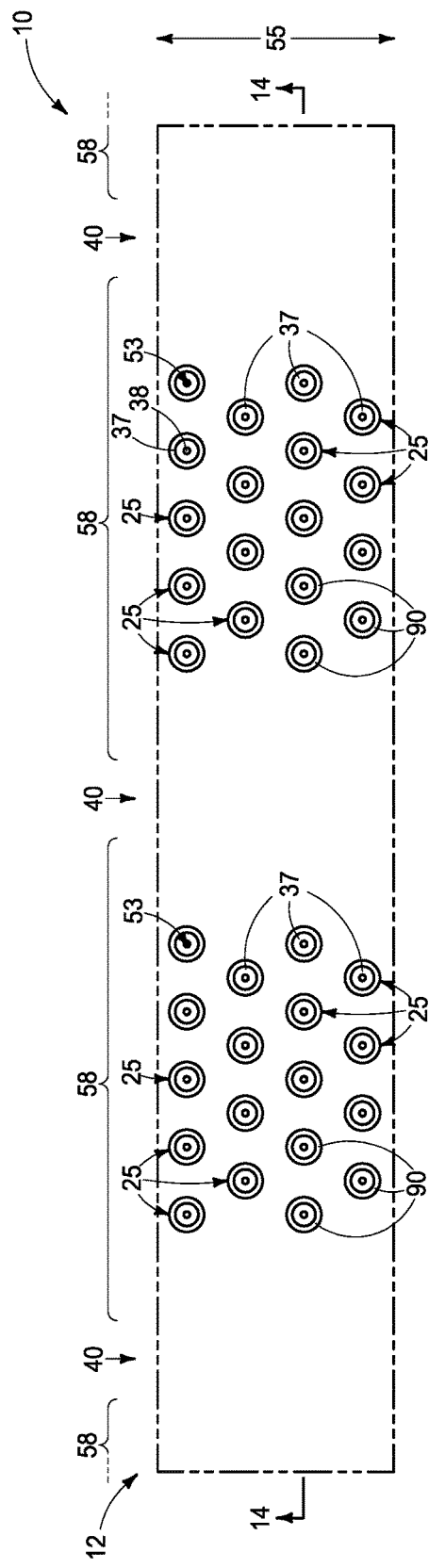
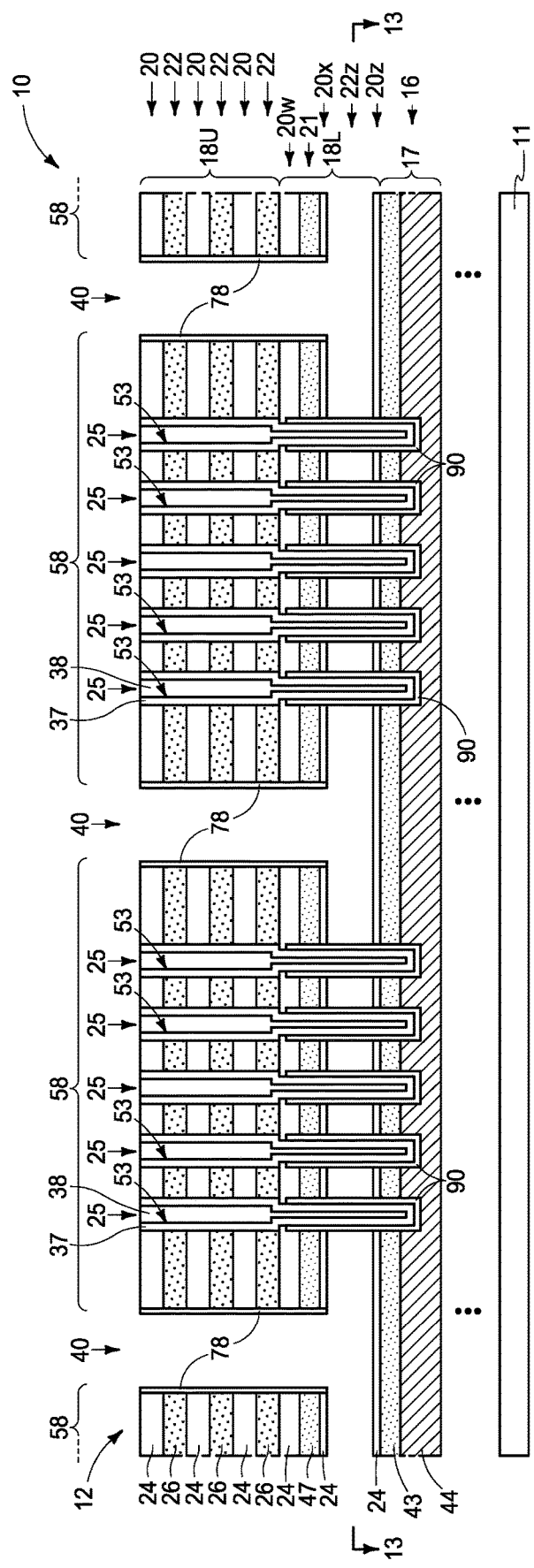
FIG. 13
FIG. 14

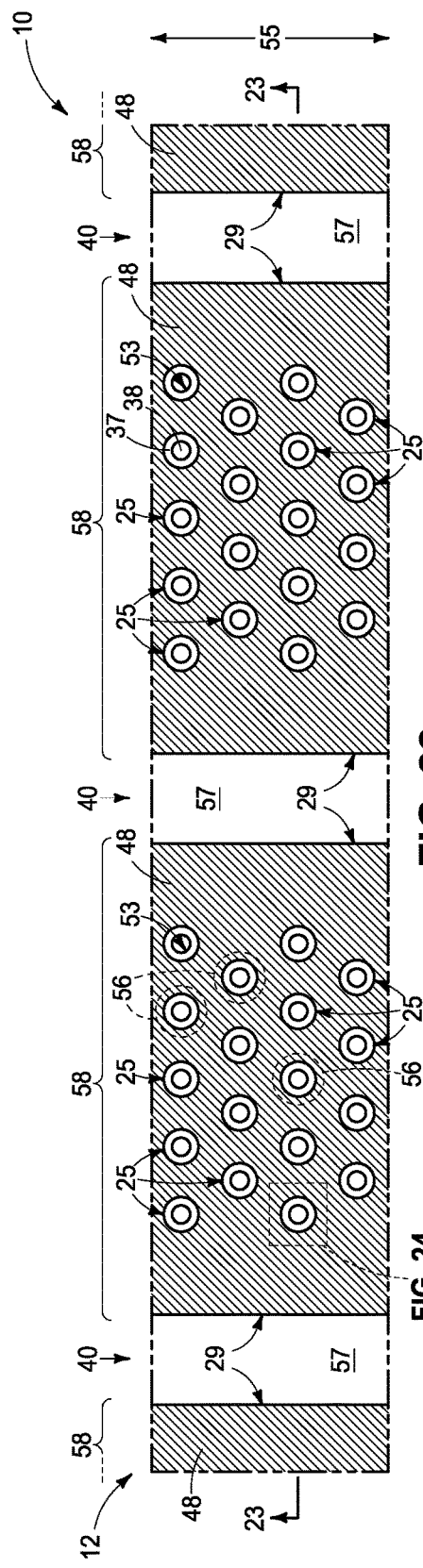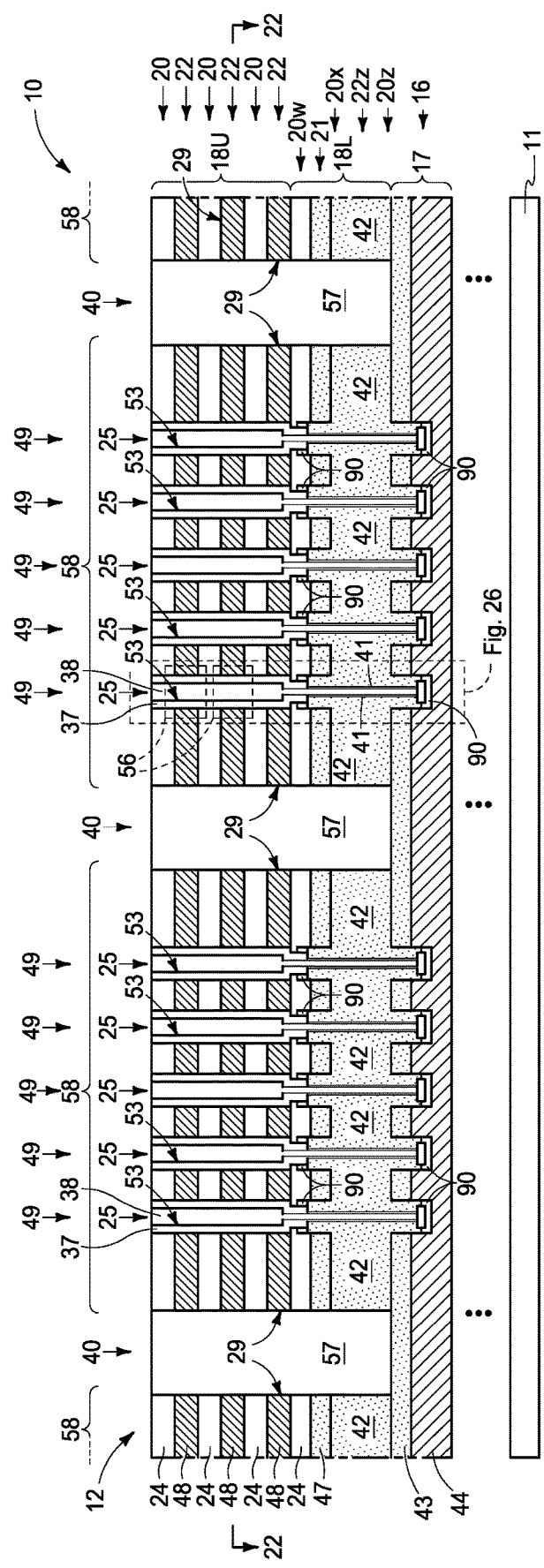

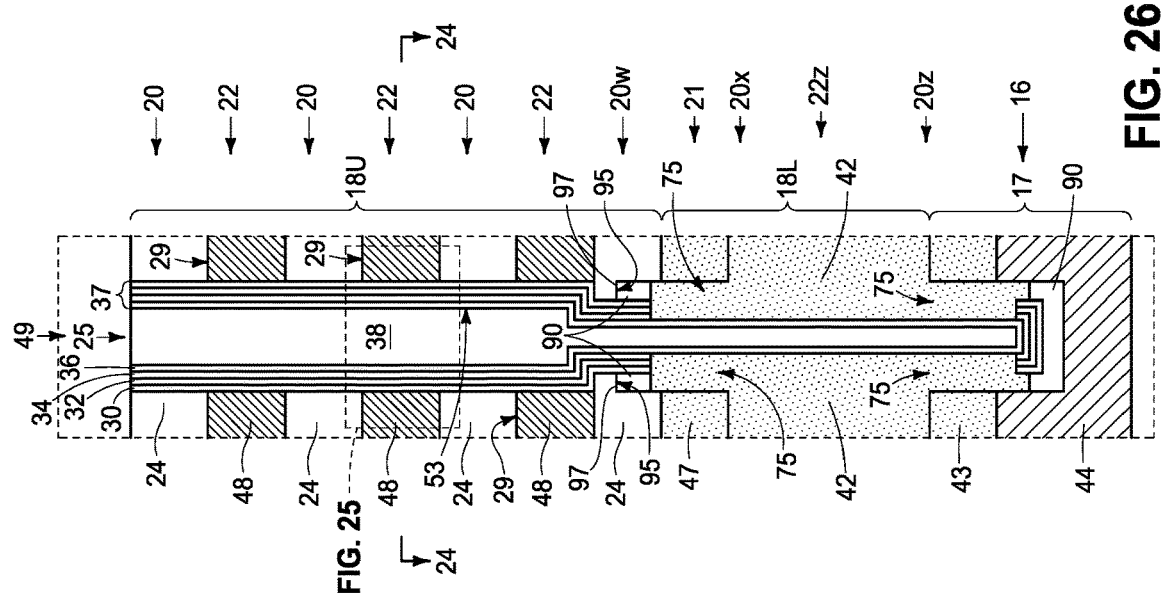
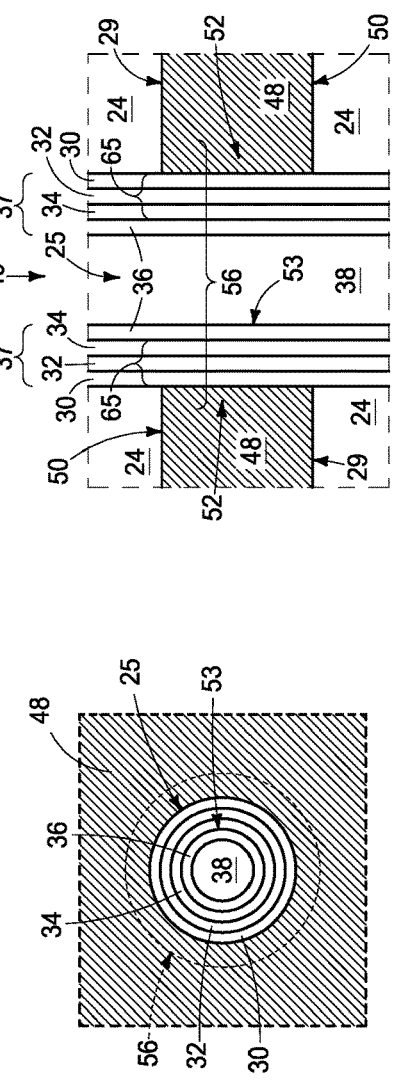
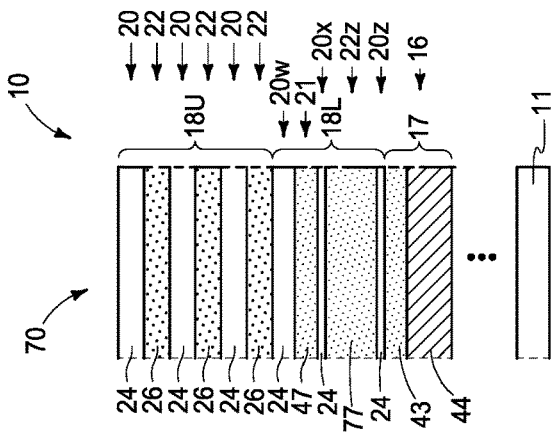
FIG. 24
FIG. 25
FIG. 26
FIG. 27

METHOD USED IN FORMING A MEMORY ARRAY COMPRISING STRINGS OF MEMORY CELLS IN WHICH LINERS ARE ISOTROPICALLY ETCHED

TECHNICAL FIELD

Embodiments disclosed herein pertain to integrated circuitry comprising a memory array comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a diagrammatic cross-sectional view taken through line 2-2 in FIG. 1.

FIGS. 3-27 are diagrammatic sequential sectional, expanded, enlarged, and/or partial views of the construction of FIGS. 1 and 2, or portions thereof, or alternate embodiments, in process in accordance with some embodiments of the invention.

DETAILED DESCRIPTION OF EXAMPLE EMBODIMENTS

Figure 3:
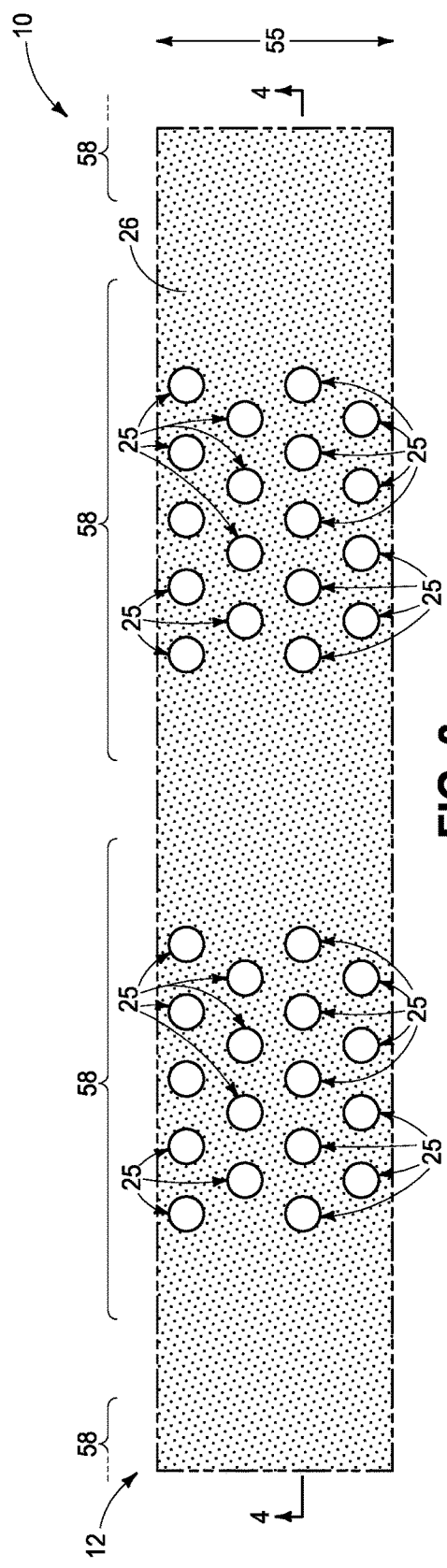

Embodiments of the invention encompass methods used in forming a memory array comprising strings of memory cells, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass existing or future-developed integrated circuitry comprising a memory array comprising strings of memory cells independent of method of manufacture, for example comprising NAND architecture. First example method embodiments are described with reference to FIGS. 1-27 which may be considered as a "gate-last" or "replacement-gate", and starting with FIGS. 1 and 2.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor material 17 comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., n-type-doped or p-type-doped polysilicon). In one embodiment, lower conductor material 44 comprises metal material (e.g., a metal silicide such as $WSi_x$). Conductor tier 16 may comprise part of control circuitry (e.g., peripheral-under-array circuitry and/or a common source line or plate) used to control read and write access to the transistors and/or memory cells that will be formed within array 12.

In one embodiment, a lower portion 18L of a stack 18* has been formed above substrate 11 and conductor tier 16 (an * being used as a suffix to be inclusive of all such same-numerically-designated components that may or may not have other suffixes). Stack 18* will comprise vertically-alternating conductive tiers 22* and insulative tiers 20*, with material of tiers 22* being of different composition from material of tiers 20*. Stack 18* comprises laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may not be discernable at this point of processing.

Conductive tier(s) 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment, lower portion 18L comprises a lowest tier 20z of second tiers 20* directly above (e.g., directly against) conductor material 17. Lowest second tier 20z is insulative (e.g., comprising a material 24 comprising silicon dioxide) and may be sacrificial. A lowest 22z of first tiers 22* is directly above (e.g., directly against) lowest second tier 20z. Lowest first tier 22z comprises sacrificial material 77 (e.g., silicon nitride or polysilicon). In one embodiment, a next-lowest tier 20x of second tiers 20* is directly above lowest first tier 22z (e.g., comprising material 24). In one embodiment, a conducting tier 21 comprising conducting material 47 (e.g., conductively-doped polysilicon) is directly above next-lowest second tier 20x and a next-next lowest second tier 20w is above conducting tier 21. Alternately, and by way of example only, lower portion 18L could have a top first tier 22* or 21 (not shown) and regardless of whether tier 20w is present.

In one embodiment, sacrificial pillars 60 have been formed in lower portion 18L and in one embodiment into conductor tier 16. Sacrificial pillars 60 are horizontally-located (i.e., in x, y coordinates) where individual channel-material strings will be formed. By way of example and for brevity only, sacrificial pillars 60 are shown as being arranged in groups or columns of staggered rows of four and five pillars 60 per row. Sacrificial pillars 60 comprise a laterally-inner material 15 (e.g., polysilicon, or a thin TiN lining having elemental tungsten radially inward thereof) and a liner 90 laterally-outward of laterally-inner material 15 (e.g., with liner 90 extending upwardly to above sacrificial material 77 (e.g., at least into material 24 of second tier 20w)). Pillars 60 may taper radially-inward (not shown) moving deeper into lower stack portion 18L. In one embodiment and as shown, liners 90 are formed to individually extend to be directly under laterally-inner material 15. In one embodiment, liners 90 are insulative, in one embodiment are conductive, and in one embodiment are semiconductive. In one embodiment, liners 90 comprise a nitride (e.g., silicon nitride, a refractory metal nitride, a non-refractory metal nitride, etc.) and in one embodiment comprise an oxide (e.g., silicon dioxide, a metal oxide, etc.)

Figure 4:
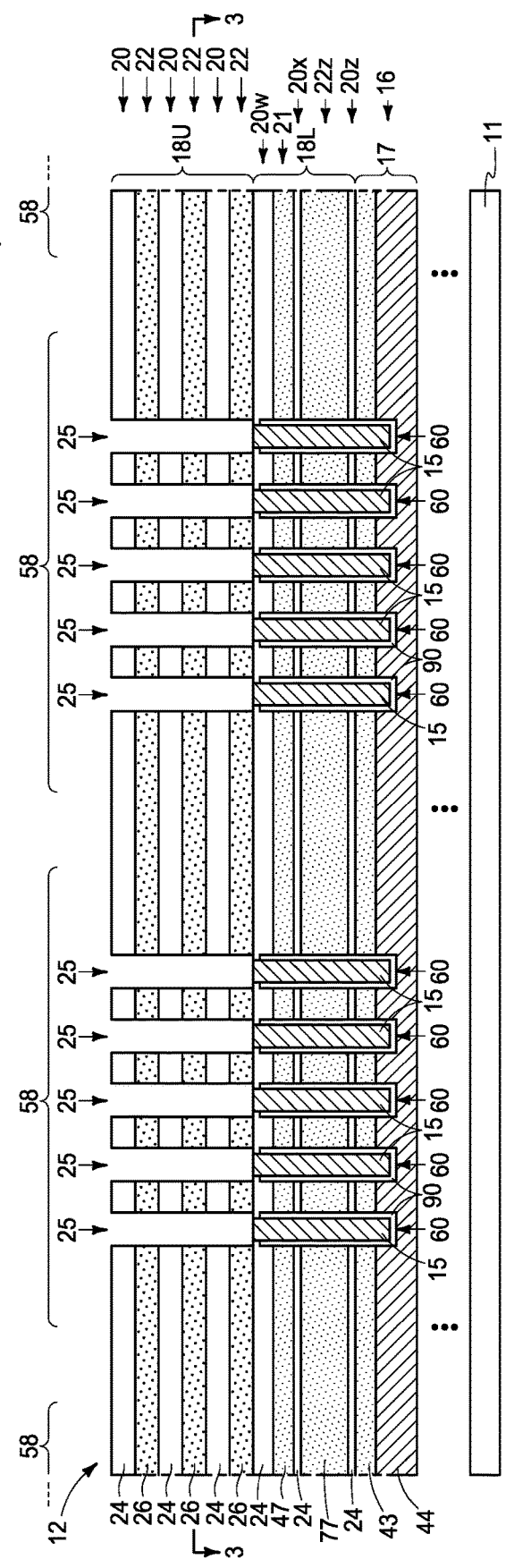

Referring to FIGS. 3 and 4, vertically-alternating first tiers 22 and second tiers 20 of an upper portion 18U of stack 18* have been formed above lower portion 18L. First tiers 22 and second tiers 20 comprise different composition materials 26 and 24 (e.g., silicon nitride and silicon dioxide), respectively. Example upper portion 18U is shown starting above lower portion 18L with a first tier 22 although such could alternately start with a second tier 20 (not shown). Further, and by way of example, lower portion 18L may be formed to have one or more first and/or second tiers as a top thereof. Regardless, only a small number of tiers 20* and 22* is shown, with more likely upper portion 18U (and thereby stack 18*) comprising dozens, a hundred or more, etc. of tiers 20 and 22. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22* and/or above an uppermost of conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier. Channel openings 25 have been formed (e.g., by etching) through second tiers 20 and first tiers 22 in upper portion 18U to sacrificial pillars 60. Openings 25 may taper radially-inward moving deeper in stack 18 (not shown)

Figure 5:
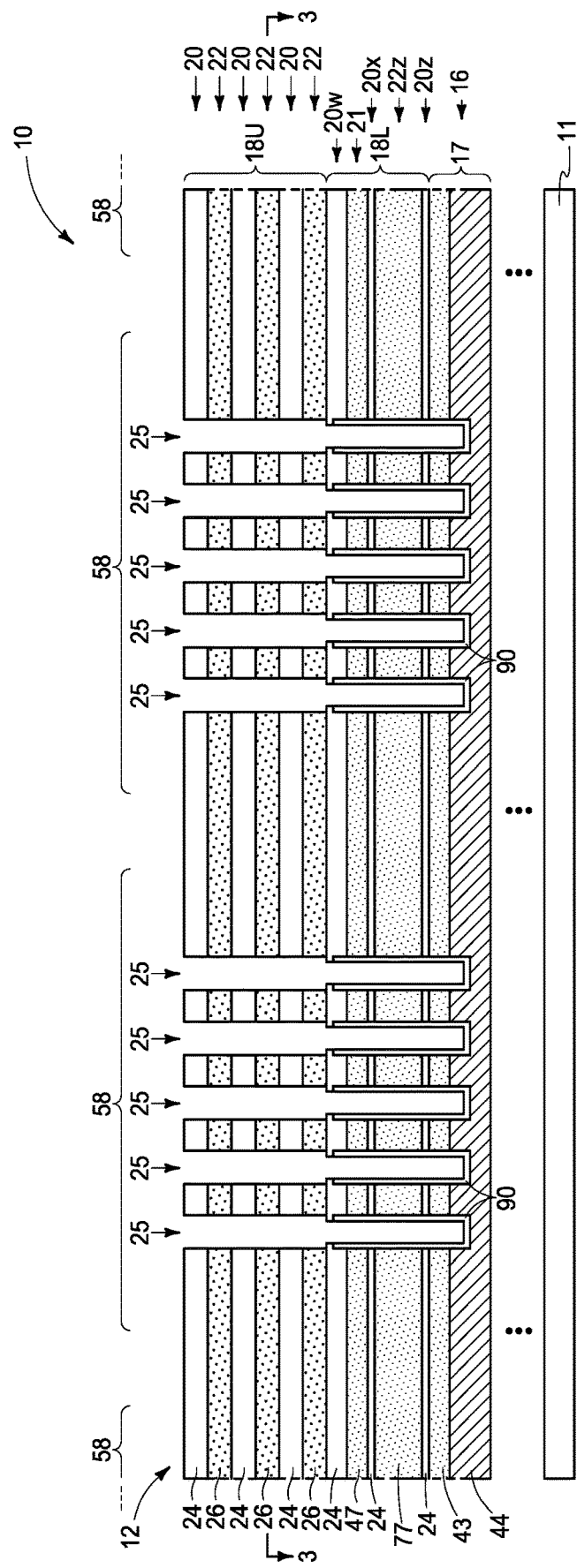

FIG. 5 shows removal of laterally-inner material 15 (not shown) of pillars 60 (not numerically designated) through openings 25 (e.g., using a mixture of ammonia and hydrogen peroxide or a mixture of sulfuric acid and hydrogen peroxide where material 15 is W) thereby extending channel openings 25 deeper into stack 18*.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

FIGS. 6-9 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and within individual channel openings 25 followed by planarizing such back at least to a top surface of stack 18*.

Channel material 36 as an operative channel-material string 53 has also been formed in individual extended channel openings 25 elevationally along insulative tiers 20 and conductive tiers 22. Channel-material strings 53 are also in voids (not numerically designated) that resulted from removing laterally-inner material 15 (not shown in extended channel openings 25) and laterally-inward of individual liners 90. Materials 30, 32, 34, and 36 are collectively shown as and only designated as material 37 in FIGS. 6 and 7 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16 (not shown). Such punch etching may occur separately with respect to each of materials 30, 32, and 34 or may occur with respect to only some. Alternately, and by way of example only and as shown, no punch etching may be conducted and channel material 36 may be directly electrically coupled to conductor material 17 of conductor tier 16 only by a separate conductive interconnect (not yet shown). A radially-central solid dielectric material 38 (e.g., spin-on-dielectric, silicon dioxide, and/or silicon nitride) is shown in extended channel openings 25. Alternately, and by way of example only, the radially-central portion in extended channel openings 25 may include void-space(s) (not shown) and/or be devoid of solid material (not shown). Regardless, and in one embodiment, liners 90 have been formed to individually extend to directly under individual channel-material strings 53 and, in one such embodiment, will remain in a finished construction as will be apparent from the continuing discussion.

Figure 6:
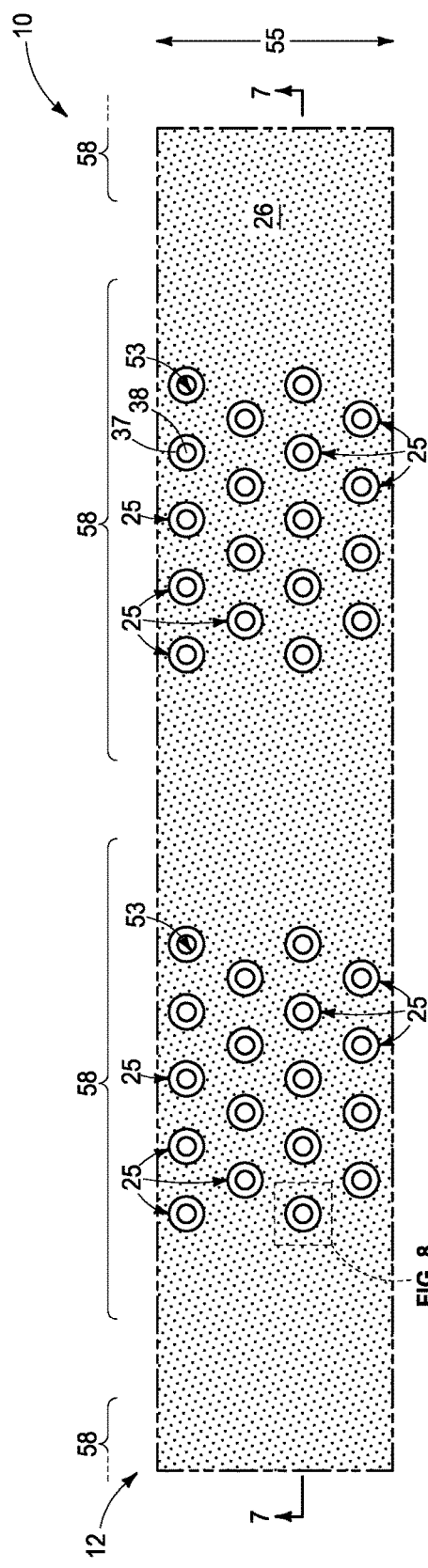
Figure 7:
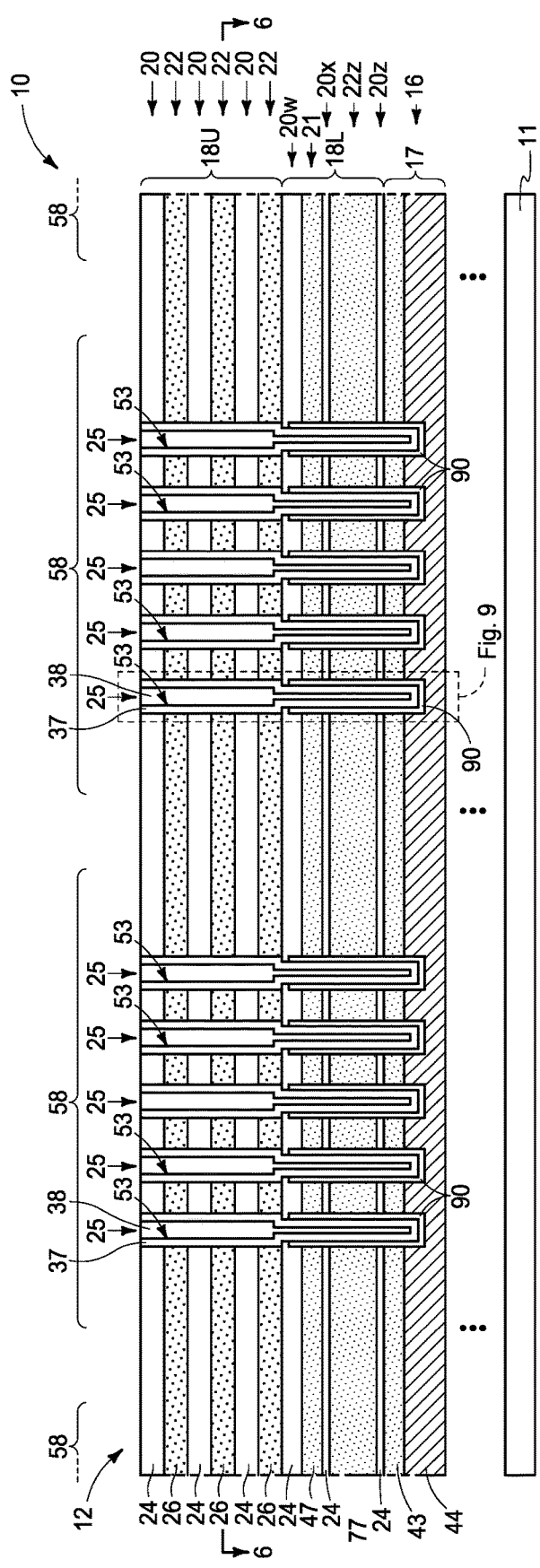
Figure 9:
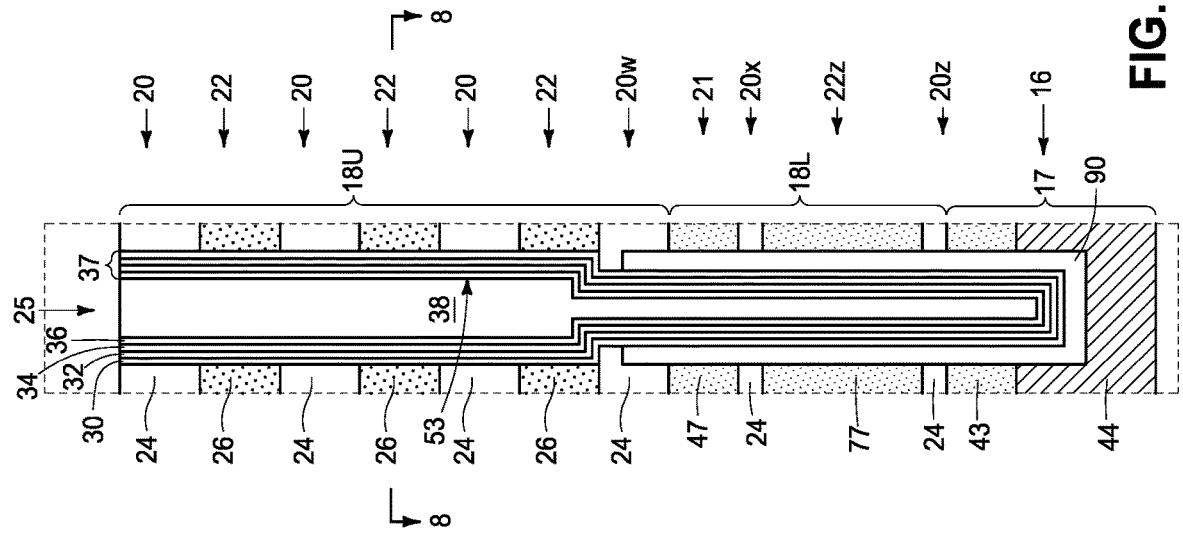
Figure 8:
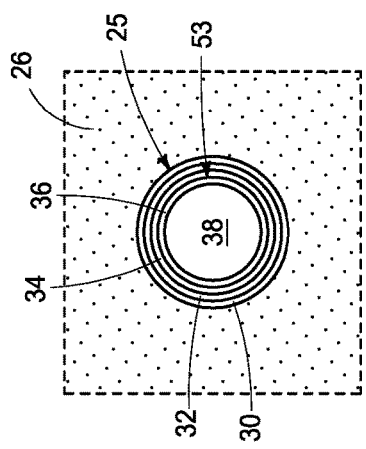
Figure 10:
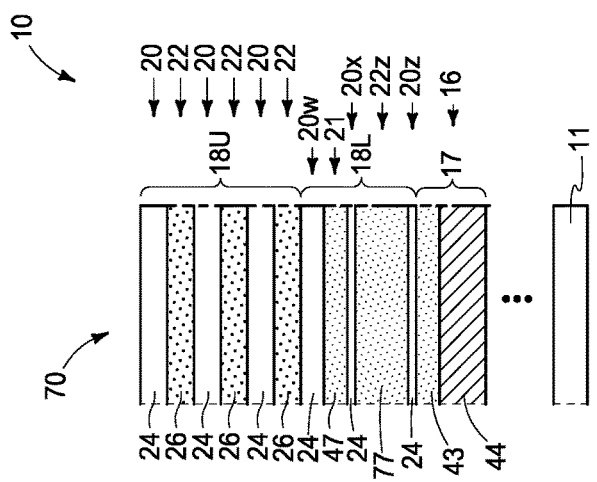

In some embodiments, construction 10 may be considered as comprising a first region (e.g., as shown by FIGS. 6 and 7) and a second region 70 aside the first region (e.g., as shown in FIG. 10). Second region 70 may be laterally-contacting the first region (not shown) or may be laterally-spaced from the first region (e.g., closely laterally thereadjacent but not touching, or laterally-far there-from and not touching). Second region 70 may be within one or more of the memory block regions (not shown). In some embodiments, construction 10 may be considered as comprising a first vertical stack (e.g., stack 18* in FIG. 7) and a second vertical stack (e.g., stack 18* in second region 70), with the second stack comprising an upper portion 18U and a lower portion 18L.

Figure 11:
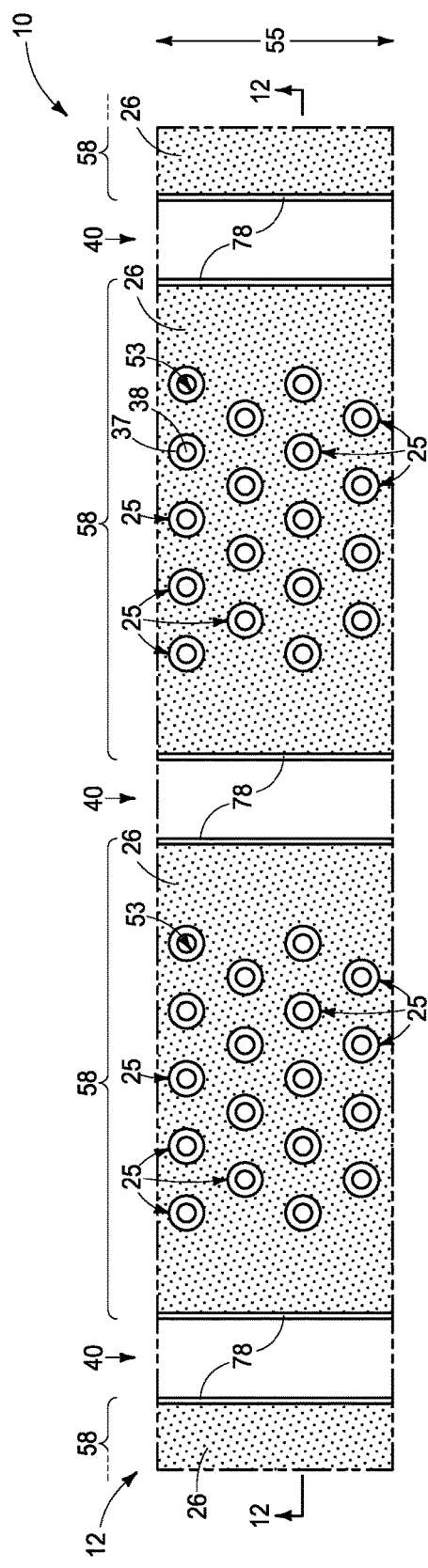
Figure 12:
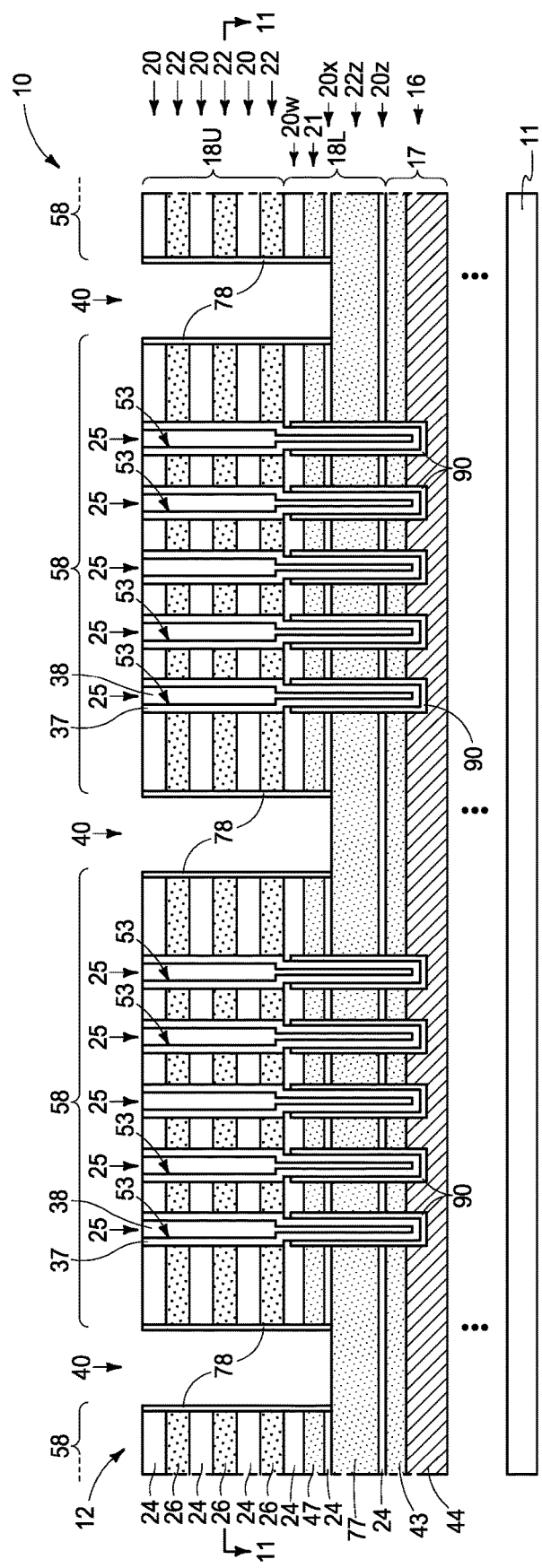

Referring to FIGS. 11 and 12, horizontally-elongated trenches 40 have been formed into stack 18* (e.g., by anisotropic etching) and are individually between immediately-laterally-adjacent memory-block regions 58 and extend to lowest first tier 22z (at least thereto). A sacrificial etch-stop line (not shown) having the same general horizontal outline as trenches 40 may individually be formed in conducting tier 21 (when present) before forming upper portion 18U. Trenches 40 may then be formed by etching materials 24 and 26 to stop on or within the material of the individual sacrificial lines, followed by exhuming remaining material of such lines analogous to forming and using pillars 60 as an etch stop as described above (regardless of whether liners 90 are formed in such etch-stop lines). Trenches 40 have been optionally lined with lining material 78 (e.g., hafnium oxide, aluminum oxide, silicon dioxide, silicon nitride, etc., and not shown). Lining material 78 may be partially or wholly sacrificial and ideally is of a composition other than that of materials 24 and 26. After deposition of lining material 78, it may be substantially removed from being over horizontal surfaces, for example by maskless anisotropic spacer-like etching thereof.

Referring to FIGS. 10, 13, and 14, sacrificial material 77 (not shown) has been isotropically etched from lowest first tier 22z through trenches 40 (e.g., using liquid or vapor $H_3PO_4$ as a primary etchant where material 77 is silicon nitride or using tetramethyl ammonium hydroxide [TMAH] where material 77 is polysilicon) to expose liners 90 that are around channel-material strings 53. In one embodiment, such isotropic etching occurs in the first region (e.g., FIGS. 13 and 14) and does not occur in second region 70 (FIG. 10), for example if trenches 40 are not formed in second region 70 or sacrificial material 77 is otherwise not etched in second region 70.

Figure 15:
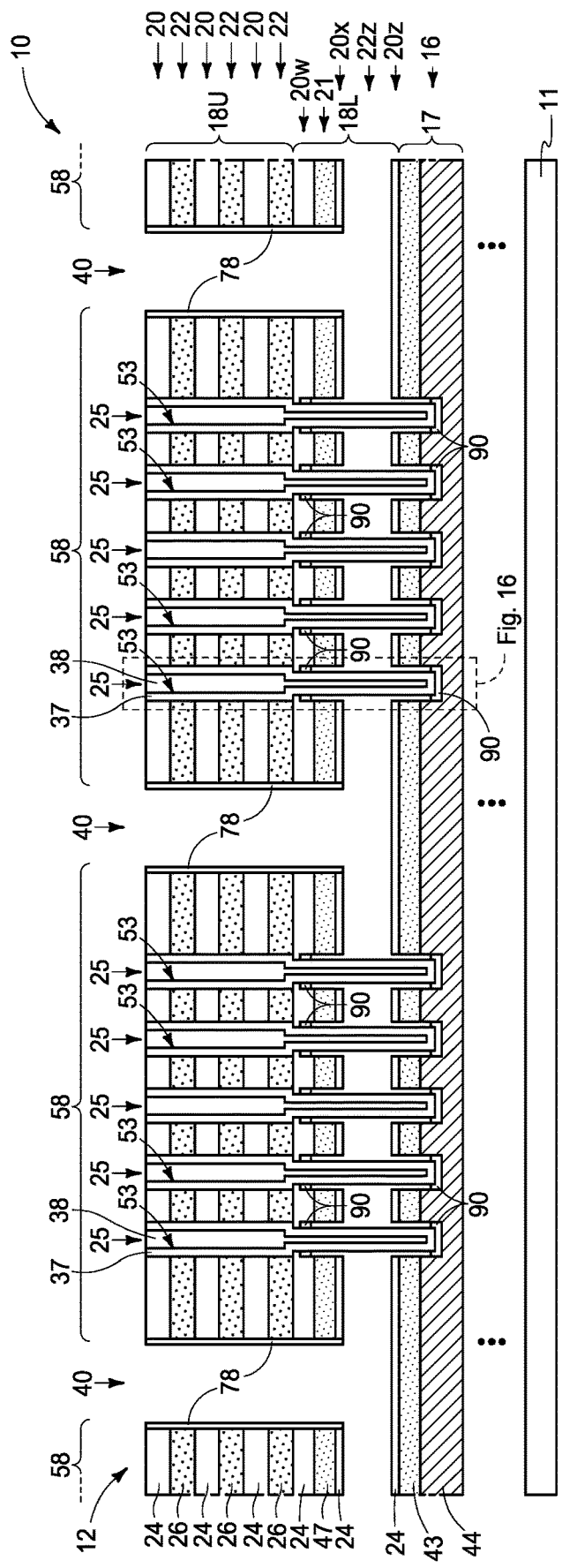
Figure 16:
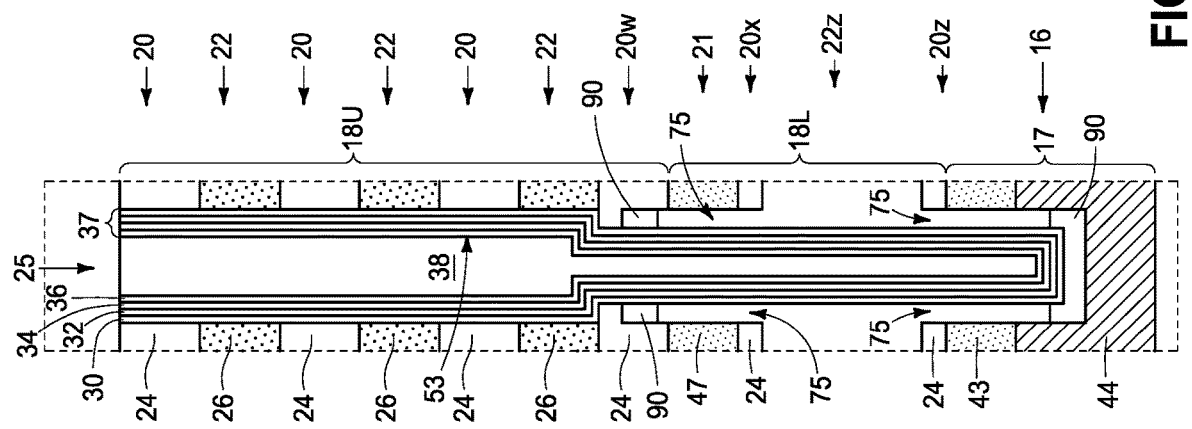

Referring to FIGS. 15 and 16, exposed liners 90 have been isotropically etched to form void-spaces 75 above lowest first tier 22z that are individually laterally-between individual channel-material strings 53 and second-tier material 24 and that are, in one embodiment, in second tier 20w that is immediately-below the lowest first tier 22* that is in upper portion 18U. Some of the material of liners 90 may remain above void-spaces 75 after such isotropic etching (as shown) or all may be removed by such isotropic etching (not shown).

Figure 17:
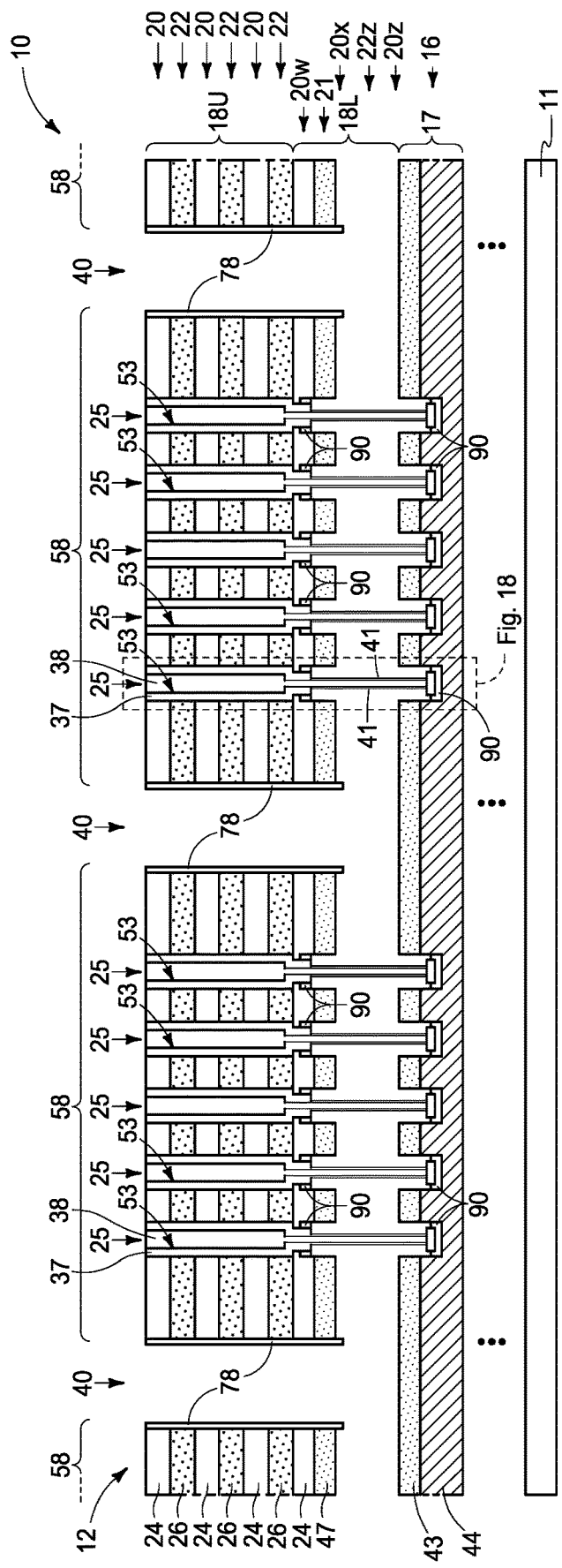
Figure 19:
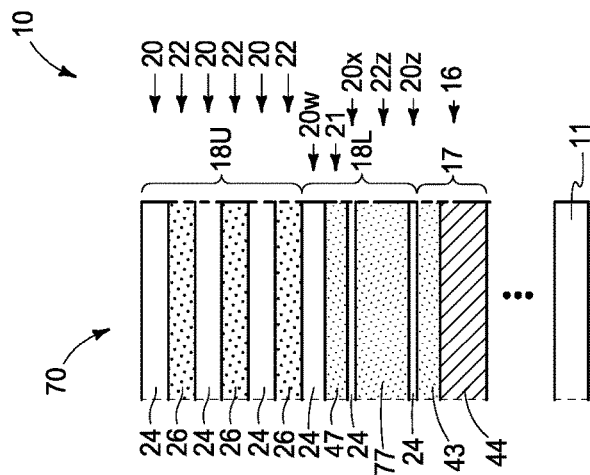
Figure 18:
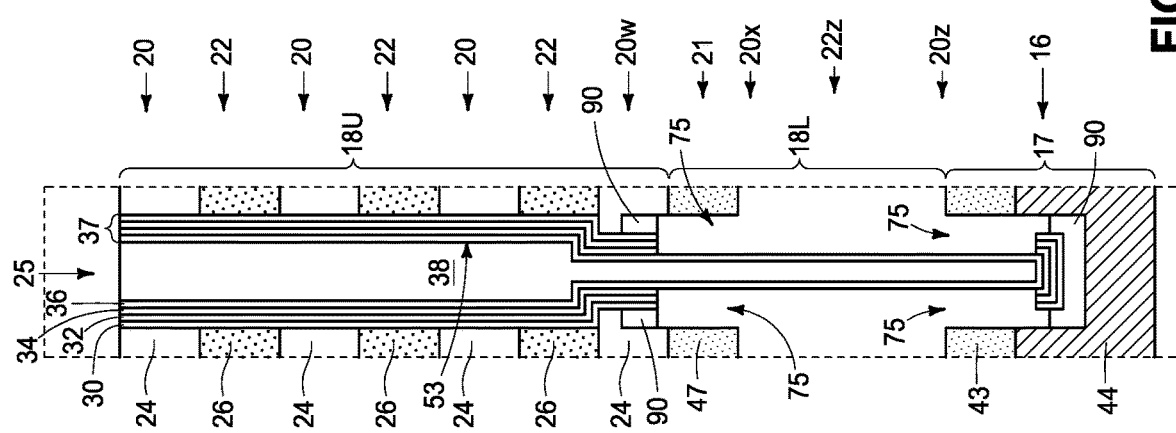

Conductively-doped semiconductive material is formed against sidewalls of the channel material of the channel-material strings and in the void-spaces. For example, referring to FIGS. 17-19, such show example subsequent processing where material 30 (e.g., silicon dioxide), material 32 (e.g., silicon nitride), and material 34 (e.g., silicon dioxide or a combination of silicon dioxide and silicon nitride) have been etched to expose a sidewall 41 of channel material 36 of channel-material strings 53 in lowest first tier 22z and in void-spaces 75. In one embodiment, remaining material of liners 90 that was above void-spaces 75 may also be removed (not shown) by such etching or otherwise, or in another embodiment such may remain (as shown). Any of materials 30, 32, and 34 in tier 22z may be considered as being sacrificial material therein. As an example, consider an embodiment where lining material 78 is one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example construction shown by FIGS. 17 and 18. The artisan is capable of selecting other chemistries for etching other different materials where a construction as shown in FIGS. 17 and 18 is desired. Some or all of the insulative material (e.g., 24, and not shown in FIGS. 17 and 18) from tiers 20x and 20z (when present, and not shown as having been removed) may be removed when removing other materials, may be removed separately, or may partially or wholly remain (not shown). Additionally, an uppermost portion of void-spaces 75 in second tier 20w may widen by such etching (not shown). In one embodiment and as shown, the removing of lowest second tier 20z and next-lowest second tier 20x has occurred in the first region (e.g., FIG. 17) and has not occurred in second region 70 (FIG. 19).

Figure 20:
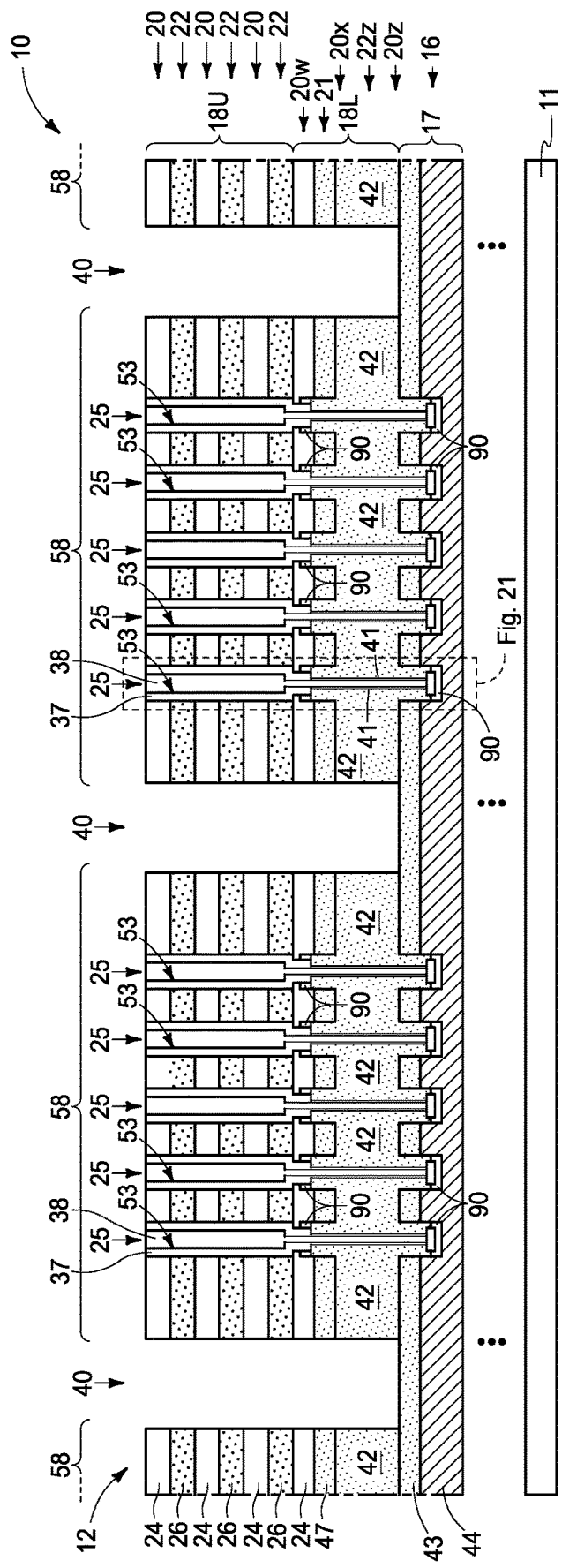
Figure 21:
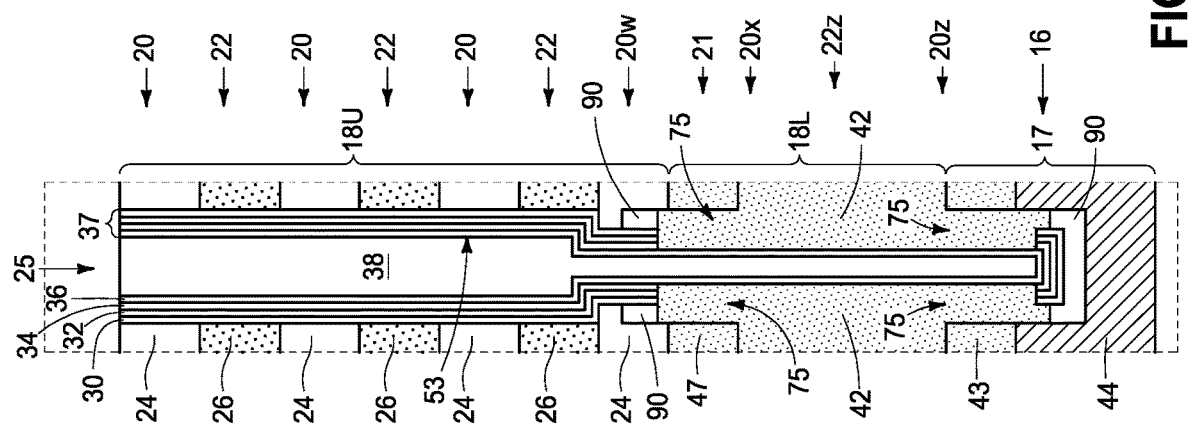

Referring to FIGS. 20 and 21, conductively-doped semiconductive material 42 (e.g., conductively-doped polysilicon) has been formed in lowest first tier 22z and which extends upwardly (e.g., and downwardly) into void-spaces 75. Conductively-doped semiconductive material 42 thereby directly electrically couples together channel material 36 of individual channel-material strings 53 and conductor material 17 of conductor tier 16. Subsequently, and by way of example, conductive material 42 has been removed from trenches 40 as has sacrificial lining material 78 (not shown). Sacrificial lining material 78 may be removed before forming conductive material 42 (not shown). Regardless, at some point, conductively-doped semiconductive material 42 is heated to diffuse conductivity-increasing dopants therein from void-spaces 75 laterally into channel material 36 that is laterally there-adjacent (e.g., at least from the upper void-spaces 75) and upwardly into the channel material 36 that is above void-spaces 75. Such heating may occur in a dedicated annealing step and/or during inherent subsequent processing and which at least in part may include the act of forming conductively-doped semiconductive material 42 itself. The artisan is capable of selecting suitable processing conditions to cause such diffusion (e.g., substrate temperature of about 400° C. to about 1,110° C. for from about 15 seconds to 1 hour).

In one embodiment, all material of liners 90 above conductor tier 16 may be removed prior to forming conductively-doped semiconductive material 42 (not shown). In one embodiment and as shown, material of liners 90 is left in conductor tier 16 and directly above which conductively-doped semiconductive material 42 is formed, and in one such embodiment such liner material that is left is of an upwardly-open container shape in a vertical cross-section (e.g., that of FIGS. 19 and 20).

The embodiments depicted by FIGS. 1-21 have the tops of liners 90 in lower portion 18L, in one such embodiment in second tier 20w, and, regardless, where liners 90 are formed before forming upper portion 18U. Alternately, by way of examples, liners 90 may be formed after forming upper portion 18U and/or have liner tops that are above lower portion 18U (neither of which is shown). Specifically, again as examples only, material 15 of sacrificial pillars 60 (FIG. 2) may not be formed. Instead, upper portion 18U could be formed with channel-openings 25 initially extending to lowest first tier 22z. Material of liners 90 may then be deposited. Such material then may be vertically recessed back to have tops positioned as shown in FIG. 2, vertically recessed back to have tops positioned in upper portion 18U (not shown), or may not be vertically recessed at all (not shown).

Referring to FIGS. 22-27, material 26 (not shown) of conductive tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of transistors and/or memory cells 56 are indicated with a bracket in FIG. 25 and some with dashed outlines in FIGS. 22-24, and 26, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 25) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22* is formed after forming openings 25/27 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

In one embodiment and as shown, the lowest surface of channel material 36 of operative channel-material strings 53 is never directly against any of conductor material 17 of conductor tier 16. In one embodiment and as shown, conductive material 42 is directly against sidewalls 41 of channel-material strings 53.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In this document, "undoped" is a material having from 0 atoms/cm$^3$ to $1\times10^{12}$ atoms/cm$^3$ of atoms of conductivity-increasing impurity in said material. In this document, "doped" is a material having more than $1\times10^{12}$ atoms/cm$^3$ of atoms of conductivity-increasing impurity therein and "conductively-doped" is material having at least $1\times10^{18}$ atoms/cm$^3$ of atoms of conductivity-increasing impurity therein. Intervening material 57 may include through array vias (not shown).

In one embodiment and as shown, the forming of conducting material 48 occurs in the first region (FIGS. 22 and 23) and not with respect to the second vertical stack 18* in second region 70 (FIG. 27). Accordingly, in one embodiment, resultant second vertical stack 18* in second region 70 comprises an upper portion 18U comprising alternating first insulating tiers 20 and second insulating tiers 22 (e.g., tiers 22 being insulative in FIG. 27). A lower portion 18L of second vertical stack 18* comprises:
  a lowest insulator tier (e.g., 20z) directly above conductor material (e.g., 17) of a conductor tier (e.g., 16);
  polysilicon-comprising first material (e.g., 77) directly above the lowest insulator tier;
  insulator material (e.g., 24 of tier 20x) directly above the polysilicon-comprising first material; and
  polysilicon-comprising second material (e.g., 47) directly above the insulator material.

Any other attribute(s) or aspect(s) as shown and/or described herein with respect to other embodiments may be used in the embodiments shown and described with reference to the above embodiments.

In one embodiment, a method used in forming a memory array (e.g., 12) comprising strings (e.g., 49) of memory cells (e.g., 56) comprises forming vertically-extending channel-material strings (e.g., 53) into a stack (e.g., 18*, and regardless of whether comprising a conductor tier 16, an upper portion 18U, a lower portion 18L, and/or sacrificial pillars 60) comprising vertically-alternating first tiers (e.g., 20*) and second tiers (e.g., 22*). Material of the first tiers (e.g., 26 or 48) is of different composition from material of the second tiers (e.g., 24). A liner (e.g., 90) is formed that is laterally-outside of individual of the channel-material strings in one of the first tiers and in one of the second tiers. The liners are isotropically etched to form void-spaces (e.g., 75) in the one second tier above the one first tier. Individual of the void-spaces are laterally-between the individual channel-material strings and the second-tier material in the one second tier. Conductively-doped semiconductive material (e.g., 42) is formed against sidewalls of the channel material of the channel-material strings in the one first tier and that extends upwardly into the void-spaces in the one second tier. The conductively-doped semiconductive material is heated to diffuse conductivity-increasing dopants therein from the void-spaces laterally into the channel material laterally there-adjacent and upwardly into the channel material that is above the void-spaces. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, integrated circuitry (e.g., 10) comprising a memory array (e.g., 12) comprising strings (e.g., 49) of memory cells (e.g., 56) comprises laterally-spaced memory blocks (e.g., 58) individually comprising a first vertical stack 18* (e.g., that of FIGS. 22 and 23) comprising alternating insulative tiers (e.g., 20*) and conductive tiers (e.g., 22*), strings (e.g., 49) of memory cells (e.g., 56) comprising channel-material strings (e.g., 53) that extend through the insulative tiers and the conductive tiers. The conductive tiers individually comprise a horizontally-elongated conductive line (e.g., 29). A second vertical stack (e.g., 18* in second region 70) is aside the first vertical stack. The second vertical stack comprises an upper portion (e.g., 18U) and a lower portion (e.g., 18L). The upper portion comprises alternating first insulating tiers 20 and second insulating tiers 22 (e.g., tiers 22 being insulative in FIG. 27). The lower portion comprises:
  a lowest insulator tier (e.g., 20z) directly above conductor material (e.g., 17) of a conductor tier (e.g., 16);
  polysilicon-comprising first material (e.g., 77) directly above the lowest insulator tier;
  insulator material (e.g., 24 of tier 20x) directly above the polysilicon-comprising first material; and
  polysilicon-comprising second material (e.g., 47) directly above the insulator material.

In one embodiment, the polysilicon-comprising first material and the polysilicon-comprising second material are of the same composition relative one another. In one embodiment, the polysilicon-comprising first material consists of or consists essentially of undoped polysilicon. In one embodiment, the polysilicon-comprising first material consists of or consists essentially of conductively-doped polysilicon. In one embodiment, the polysilicon-comprising second material consists of or consists essentially of undoped polysilicon. In one embodiment, the polysilicon-comprising second material consists of or consists essentially of conductively-doped polysilicon. In one embodiment, the insulator material and material of the lowest insulator material are of the same composition relative one another. In one embodiment, the same composition comprises, consists of, or consists essentially of silicon dioxide. Any other attribute(s) or aspect(s) as shown and/or described herein with respect to other embodiments may be used.

In one embodiment, integrated circuitry (e.g., 10) comprising a memory array (e.g., 12) comprising strings (e.g., 49) of memory cells (e.g., 56), comprises laterally-spaced memory blocks (e.g., 56) individually comprising a vertical stack (e.g., 18*) comprising alternating insulative tiers (e.g., 20*) and conductive tiers (e.g., 22*), strings (e.g., 49) of memory cells (e.g., 56) comprising channel-material strings (e.g., 53) that extend through the insulative tiers and the conductive tiers. The conductive tiers individually comprise a horizontally-elongated conductive line (e.g., 29). Insulating material (e.g., 24) that is immediately-below the horizontally-elongated conductive line 29 that is in a lowest of the conductive tiers comprises a jog surface (e.g., 95 in FIG. 26) on each side of individual of the channel-material strings in a vertical cross-section (e.g., FIGS. 23, 26). In this document, a "jog surface" is characterized or defined by an abrupt change in direction [at least 15° ] in comparison to surfaces that are immediately-above and immediately-below the jog surface. In one embodiment, the jog surface includes a portion (e.g., 97 in FIG. 26) that is horizontal, and in one such embodiment that is exactly horizontal. Any other attribute(s) or aspect(s) as shown and/or described herein with respect to other embodiments may be used.

Method embodiments of the invention may result in greater conductivity doping in channel material 36 due to upwardly-extending material 42 in void-spaces 75.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 900 or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming vertically-extending channel-material strings into a stack comprising vertically-alternating first tiers and second tiers. Material of the first tiers is of different composition from material of the second tiers. A liner is formed laterally-outside of individual of the channel-material strings in one of the first tiers and in one of the second tiers. The liners are isotropically etched to form void-spaces in the one second tier above the one first tier. Individual of the void-spaces are laterally-between the individual channel-material strings and the second-tier material in the one second tier. Conductively-doped semiconductive material is formed against sidewalls of the channel material of the channel-material strings in the one first tier and that extends upwardly into the void-spaces in the one second tier. The conductively-doped semiconductive material is heated to diffuse conductivity-increasing dopants therein from the void-spaces laterally into the channel material laterally there-adjacent and upwardly into the channel material that is above the void-spaces.

In some embodiments, a method used in forming a memory array comprising strings of memory cells comprises forming a conductor tier comprising conductor material on a substrate. A lower portion of a stack is formed that will comprise vertically-alternating first tiers and second tiers above the conductor tier. The stack comprises laterally-spaced memory-block regions. Material of the first tiers is of different composition from material of the second tiers. A lowest of the first tiers in the lower portion comprises sacrificial material. The vertically-alternating first tiers and second tiers of an upper portion of the stack are formed above the lower portion and channel openings are formed through the upper portion to the sacrificial material in the lower portion. A liner is formed in individual of the channel openings laterally-aside the sacrificial material. The liners extend upwardly above the sacrificial material. Channel-material strings are formed in the channel openings that extend through the first tiers and the second tiers in the upper portion to the lowest first tier in the lower portion. Individual of the channel-material strings are laterally-inward of individual of the liners. Horizontally-elongated trenches are formed into the stack that are individually between immediately-laterally-adjacent of the memory-block regions and extend to the lowest first tier. The sacrificial material is isotropically etched from the lowest first tier through the trenches to expose the liners. The exposed liners are isotropically etched to form void-spaces above the lowest first tier that are individually laterally-between the individual channel-material strings and the second-tier material that is in the second tier that is immediately-below the lowest first tier that is in the upper portion. Conductively-doped semiconductive material is formed against sidewalls of the channel material of the channel-material strings that directly electrically couples together the channel material of the individual channel-material strings and the conductor material of the conductor tier. The conductively-doped semiconductive material extends upwardly into the void-spaces. The conductively-doped semiconductive material is heated to diffuse conductivity-increasing dopants therein from the void-spaces laterally into the channel material laterally there-adjacent and upwardly into the channel material that is above the void-spaces.

In some embodiments, a method used in forming a memory array comprising strings of memory cells comprises forming a conductor tier comprising conductor material on a substrate. A lower portion of a stack is formed that will comprise vertically-alternating first tiers and second tiers above the conductor tier. The stack comprises laterally-spaced memory-block regions. Material of the first tiers is of different composition from material of the second tiers. A lowest of the first tiers in the lower portion comprises sacrificial material. Pillars are formed in the lower portion that are individually horizontally-located where individual channel-material strings will be formed. Individual of the pillars comprise a laterally-inner material and a liner laterally-outward of the laterally-inner material. The liner extends upwardly above the sacrificial material. Vertically-alternating first tiers and second tiers of an upper portion of the stack are formed above the lower portion and the pillars. Channel openings are formed into the stack that individually extend to the individual pillars. The laterally-inner material of the pillars is removed through the channel openings to extend the channel openings deeper into the stack. Individual of the channel-material strings are formed in individual of the extended channel openings and in voids therein resulting from said removing and laterally-inward of individual of the liners. Horizontally-elongated trenches are formed into the stack that are individually between immediately-laterally-adjacent of the memory-block regions and extend to the lowest first tier. The sacrificial material is isotropically etched from the lowest first tier through the trenches to expose the liners. The exposed liners are isotropically etched to form void-spaces above the lowest first tier that are individually laterally-between the individual channel-material strings and the second-tier material that is in the second tier that is immediately-below the lowest first tier that is in the upper portion. Conductively-doped semiconductive material is formed against sidewalls of the channel material of the channel-material strings that directly electrically couples together the channel material of the individual channel-material strings and the conductor material of the conductor tier. The conductively-doped semiconductive material extends upwardly into the void-spaces. The conductively-doped semiconductive material is heated to diffuse conductivity-increasing dopants therein from the void-spaces laterally into the channel material laterally there-adjacent and upwardly into the channel material that is above the void-spaces.

In some embodiments, integrated circuitry comprising a memory array comprises strings of memory cells comprising laterally-spaced memory blocks individually comprising a first vertical stack comprising alternating insulative tiers and conductive tiers. Strings of memory cells comprise channel-material strings that extend through the insulative tiers and the conductive tiers. The conductive tiers individually comprise a horizontally-elongated conductive line. A second vertical stack is aside the first vertical stack. The second vertical stack comprises an upper portion and a lower portion. The upper portion comprises alternating first insulating tiers and second insulating tiers. The lower portion comprises a lowest insulator tier directly above conductor material of a conductor tier. Polysilicon-comprising first material is directly above the lowest insulator tier. Insulator material is directly above the polysilicon-comprising first material. Polysilicon-comprising second material is directly above the insulator material.

In some embodiments, integrated circuitry comprising a memory array comprises strings of memory cells comprising laterally-spaced memory blocks individually comprising a vertical stack comprising alternating insulative tiers and conductive tiers. Strings of memory cells comprise channel-material strings that extend through the insulative tiers and the conductive tiers. The conductive tiers individually comprise a horizontally-elongated conductive line. Insulating material that is immediately-below the horizontally-elongated conductive line that is in a lowest of the conductive tiers comprises a jog surface on each side of individual of the channel-material strings in a vertical cross-section.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
    forming a conductor tier comprising conductor material on a substrate;
    forming a stack comprising vertically-alternating first tiers and second tiers above the conductor tier, material of the first tiers being of different composition from material of the second tiers;
    forming vertically-extending channel-material strings into the stack;
    forming a liner laterally-outside of individual of the channel-material strings in one of the first tiers and in one of the second tiers;
    isotropically etching the liners to form void-spaces in the one second tier above the one first tier, individual of the void-spaces being laterally-between the individual channel-material strings and the second-tier material in the one second tier, the liners before and after the isotropically etching individually having their uppermost surface above the conductor tier, below a bottom of an uppermost of the first tiers, and below uppermost surfaces of the individual channel-material strings;
    forming conductively-doped semiconductive material against sidewalls of the channel material of the channel-material strings in the one first tier and that extends upwardly into the void-spaces in the one second tier; and
    heating the conductively-doped semiconductive material to diffuse conductivity-increasing dopants therein from the void-spaces laterally into the channel material laterally there-adjacent and upwardly into the channel material that is above the void-spaces.

2. The method of claim 1 wherein the liners are insulative.

3. The method of claim 1 wherein the liners are conductive.

4. The method of claim 1 wherein the liners are semiconductive.

5. The method of claim 1 wherein the liners comprise a nitride.

6. The method of claim 5 wherein the liners consist essentially of or consist of the nitride.

7. The method of claim 1 wherein the liners comprise an oxide.

8. The method of claim 5 wherein the liners consist essentially of or consist of the oxide.

9. The method of claim 1 comprising forming the liners to individually extend to directly under the individual channel-material strings.

10. The method of claim 9 wherein the liners individually extend to directly under the individual channel-material strings in a finished construction.

11. A method used in forming a memory array comprising strings of memory cells, comprising:
    forming a conductor tier comprising conductor material on a substrate;
    forming a lower portion of a stack that will comprise vertically-alternating first tiers and second tiers above the conductor tier, the stack comprising laterally-spaced memory-block regions, material of the first tiers being of different composition from material of the second tiers, a lowest of the first tiers in the lower portion comprising sacrificial material;

forming the vertically-alternating first tiers and second tiers of an upper portion of the stack above the lower portion and forming channel openings through the upper portion to the sacrificial material in the lower portion;

forming a liner in individual of the channel openings laterally-aside the sacrificial material, the liners extending upwardly above the sacrificial material;

forming channel-material strings in the channel openings that extend through the first tiers and the second tiers in the upper portion to the lowest first tier in the lower portion, individual of the channel-material strings being laterally-inward of individual of the liners;

forming horizontally-elongated trenches into the stack that are individually between immediately-laterally-adjacent of the memory-block regions and extend to the lowest first tier;

isotropically etching the sacrificial material from the lowest first tier through the trenches to expose the liners;

isotropically etching the exposed liners to form void-spaces above the lowest first tier that are individually laterally-between the individual channel-material strings and the second-tier material that is in the second tier that is immediately-below the lowest first tier that is in the upper portion, the liners before and after the isotropically etching individually having their uppermost surface above the conductor tier, below a bottom of an uppermost of the first tiers, and below uppermost surfaces of the individual channel-material strings;

forming conductively-doped semiconductive material against sidewalls of the channel material of the channel-material strings that directly electrically couples together the channel material of the individual channel-material strings and the conductor material of the conductor tier, the conductively-doped semiconductive material extending upwardly into the void-spaces; and heating the conductively-doped semiconductive material to diffuse conductivity-increasing dopants therein from the void-spaces laterally into the channel material laterally there-adjacent and upwardly into the channel material that is above the void-spaces.

12. The method of claim 11 comprising removing all material of the liners above the conductor tier prior to forming the conductively-doped semiconductive material.

13. The method of claim 11 comprising leaving material of the liners in the conductor tier and directly above which the conductively-doped semiconductive material is formed.

14. The method of claim 11 comprising:
removing all material of the liners above the conductor tier prior to forming the conductively-doped semiconductive material; and
leaving material of the liners in the conductor tier and directly above which the conductively-doped semiconductive material is formed.

15. The method of claim 11 wherein the liners are formed before forming the upper portion of the stack.

16. A method used in forming a memory array comprising strings of memory cells, comprising:
forming a conductor tier comprising conductor material on a substrate;
forming a stack comprising vertically-alternating first tiers and second tiers above the conductor tier, material of the first tiers being of different composition from material of the second tiers;
forming vertically-extending channel-material strings into the stack;
forming a liner laterally-outside of individual of the channel-material strings in one of the first tiers and in one of the second tiers;
after forming the vertically-extending channel-material strings, isotropically etching the liners to form void-spaces in the one second tier above the one first tier, individual of the void-spaces being laterally-between the individual channel-material strings and the second-tier material in the one second tier, the isotropically etching removing all material of the liners above the conductor tier such that none of the material of the liners remains above the void-spaces;
after the isotropically etching, forming conductively-doped semiconductive material against sidewalls of the channel material of the channel-material strings in the one first tier and that extends upwardly into the void-spaces in the one second tier; and
heating the conductively-doped semiconductive material to diffuse conductivity-increasing dopants therein from the void-spaces laterally into the channel material laterally there-adjacent and upwardly into the channel material that is above the void-spaces.

17. A method used in forming a memory array comprising strings of memory cells, comprising:
forming vertically-extending channel-material strings into a stack comprising vertically-alternating first tiers and second tiers, material of the first tiers being of different composition from material of the second tiers;
forming a liner laterally-outside of individual of the channel-material strings in one of the first tiers and in one of the second tiers, the liner being conductive;
isotropically etching the liners to form void-spaces in the one second tier above the one first tier, individual of the void-spaces being laterally-between the individual channel-material strings and the second-tier material in the one second tier;
forming conductively-doped semiconductive material against sidewalls of the channel material of the channel-material strings in the one first tier and that extends upwardly into the void-spaces in the one second tier; and
heating the conductively-doped semiconductive material to diffuse conductivity-increasing dopants therein from the void-spaces laterally into the channel material laterally there-adjacent and upwardly into the channel material that is above the void-spaces.

* * * * *